Figure 1:
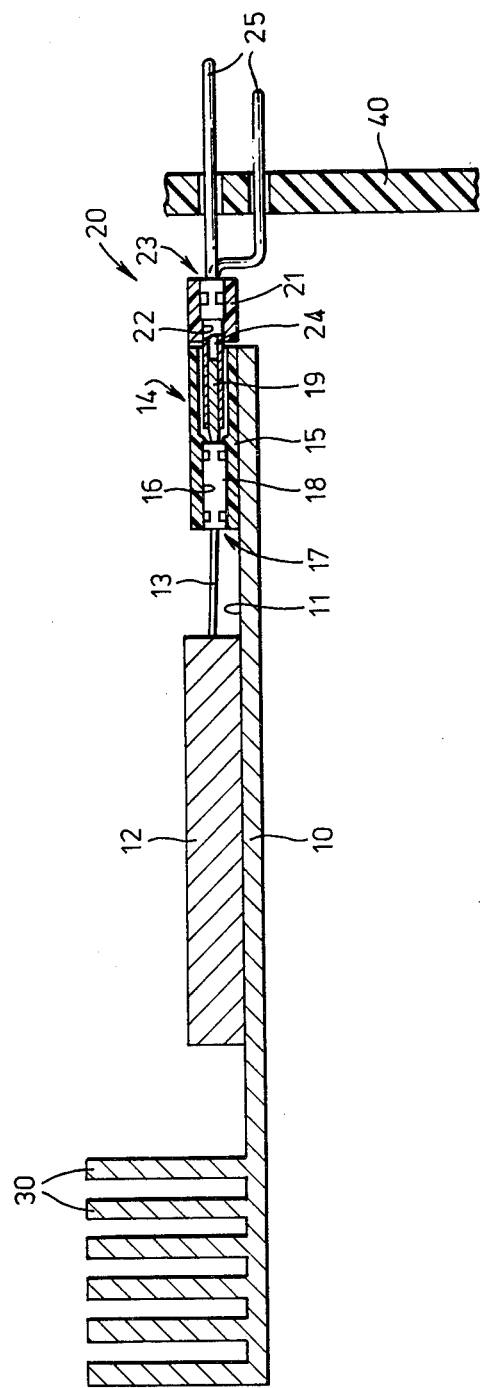

United States Patent [19]

Bell et al.

[11] 4,389,697
[45] Jun. 21, 1983

[54] CIRCUIT ASSEMBLY HAVING A COMPONENT WITH LEADS EXTENDING THEREFROM AND A CONNECTOR BOTH SUPPORTED ON A PLANAR SUBSTRATE

[75] Inventors: Melvyn R. Bell, Woodbank; John M. Morrison; Charles M. Stewart, both of Edinburgh, all of Scotland

[73] Assignee: Ferranti plc, Gatley, England

[21] Appl. No.: 288,807

[22] Filed: Jul. 31, 1981

Related U.S. Application Data

[63] Continuation of Ser. No. 18,572, Oct. 3, 1979, abandoned.

[51] Int. Cl.³ ............................................. H05K 7/02
[52] U.S. Cl. ................................... 361/380; 361/386; 361/426; 339/17 C
[58] Field of Search .................. 174/16 HS, 52 FP; 339/112 R, 17 C; 361/386–389, 392–394, 400, 405, 417, 419, 412, 413, 426, 331, 380

[56] References Cited

U.S. PATENT DOCUMENTS

| | | | |
|---|---|---|---|
| Re. 29,683 | 6/1978 | Ocken, Jr. ................... | 174/52 PE |
| 2,951,185 | 8/1960 | Buck ........................... | 361/412 |
| 3,475,657 | 10/1969 | Knowles ...................... | 339/17 C |
| 3,506,879 | 4/1970 | Maxwell ...................... | 339/17 C |
| 3,514,737 | 5/1970 | Renshaw, Jr. ................ | 339/17 C |
| 3,646,399 | 2/1972 | Mars ............................ | 361/386 |
| 3,899,720 | 8/1975 | Peterson ..................... | 174/DIG. 3 |

FOREIGN PATENT DOCUMENTS

| | | |
|---|---|---|
| 507108 | 6/1939 | United Kingdom . |
| 1212158 | 11/1970 | United Kingdom . |
| 1254508 | 11/1971 | United Kingdom . |
| 1363984 | 8/1974 | United Kingdom . |

Primary Examiner—G. P. Tolin
Attorney, Agent, or Firm—Kerkam, Stowell, Kondracki & Clarke

[57] ABSTRACT

A circuit assembly has at least one component comprising a thin film module, or a discrete component, with leads extending therefrom, the assembly also including a substantially planar substrate supporting the component, and at least one connector with a block of electrical insulating material either adhering to or integral with the substrate, and with a plurality of connector pieces, secured to the block, co-operating with the leads, and comprising terminals of the circuit assembly.

1 Claim, 2 Drawing Figures

CIRCUIT ASSEMBLY HAVING A COMPONENT WITH LEADS EXTENDING THEREFROM AND A CONNECTOR BOTH SUPPORTED ON A PLANAR SUBSTRATE

DESCRIPTION

This invention is a continuation of Ser. No. 018,572, filed Oct. 3, 1979, now abandoned and relates to circuit assemblies, and in particular to circuit assemblies each having at least one component, comprising either a discrete component or a module, with leads extending therefrom, and an at least substantially planar substrate upon which each constituent component is supported, possibly the at least substantially planar substrate comprising a heat sink.

It is an object of the present invention to provide such a circuit assembly having a construction which facilitates the provision of required electrical interconnections between the leads extending from each constituent component and terminals for the circuit assembly.

Figure 2:
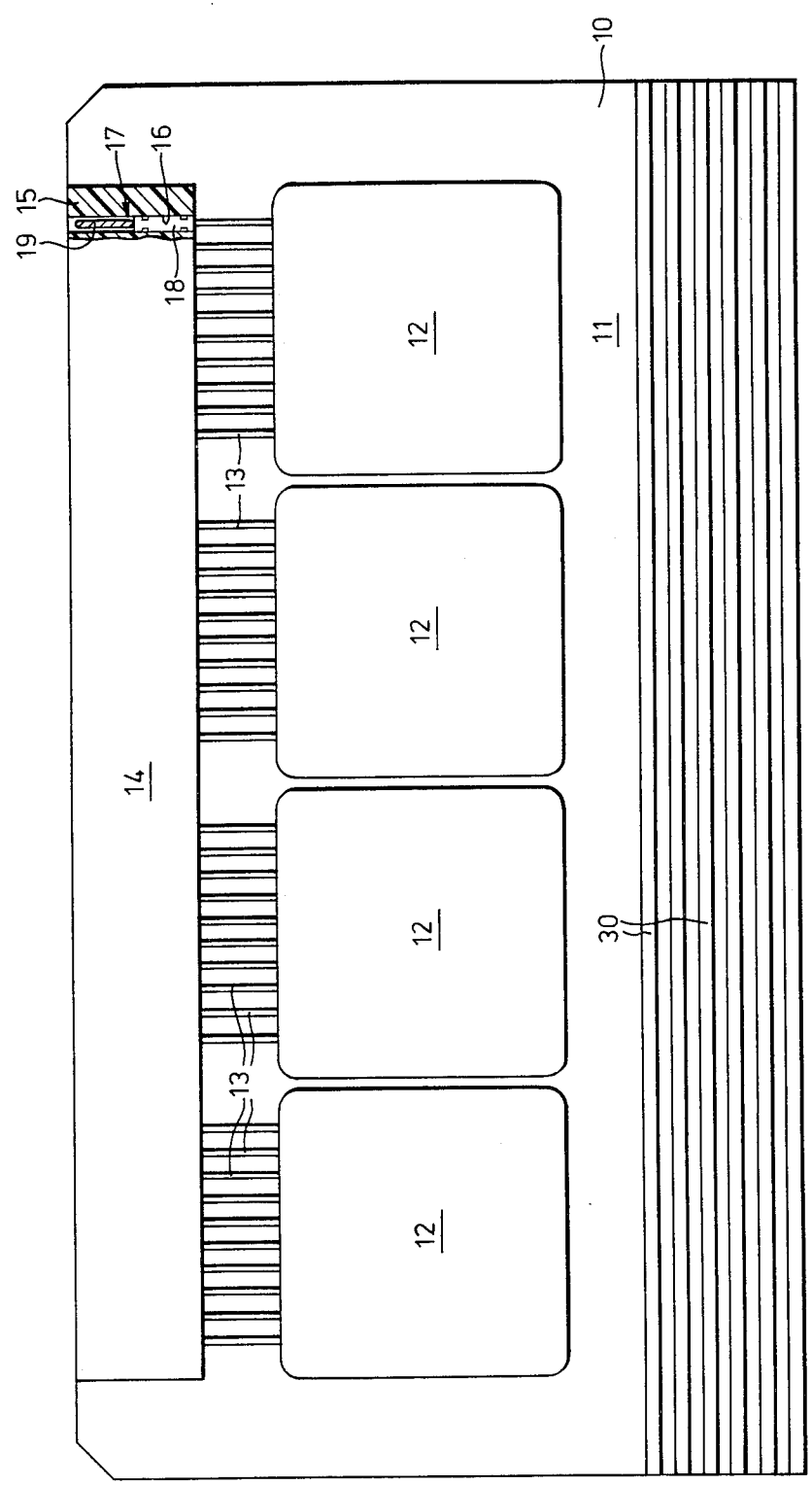

The present invention will now be described by way of example with reference to the accompanying drawings, in which FIG. 1 is a sectional side elevation of one embodiment of a circuit assembly according to the present invention, and FIG. 2 is a plan view, partially sectional, of part of the circuit assembly of FIG. 1.

The illustrated circuit assembly has a substantially planar substrate comprising a heat sink 10 of aluminium, the substrate being rectangular shaped in plan. Adhering to one major surface 11 of the heat sink 10 are four, square shaped-in plan, modules 12 having leads 13 extending from one surface thereof. Also adhering to the major surface 11, adjacent to one edge thereof, and comprising part of the circuit assembly, is a connector 14 of a known construction. The connector 14 comprises a block 15 of electrically insulating material, in bores 16 in which block 15 are provided a plurality of electrically conducting connector pieces 17, with a connector piece 17 individually in each bore 16. Each connector piece 17 has a socket part 18 to receive a module lead 13, and an integral spigot part 19, to co-operate with a socket of a second connector 20, shown only in FIG. 1, and also of a known construction. Each connector piece 17 does not extend beyond the bore 16, and so is substantially embedded within the block 15. The socket part 18 of each connector piece 17 is arranged to be capable of being tightened around the co-operating module lead 13 before the connector piece 17 is inserted into its bore 16 in the block 15. Each socket part may not comprise a complete cylinder, but may comprise any convenient construction having at least one portion to be tightened around the co-operating module lead 13. The construction of the connector piece 17 as a whole is such that the connector piece is a press fit within the bore 16 of the block 15, after the connector piece has been secured to a module lead 13.

In fabricating the circuit assembly, initially the socket parts 18 of the connector pieces 17 of the connector 14 are secured to the leads 13 of the modules 12. The connector pieces 17 are secured within the block 15 of insulating material. The connector 14 and the modules 12 are then secured to the at least substantially planar heat sink 10. In the circuit assembly the leads 13 of the modules extend substantially parallel to the major surface 11 of the heat sink 10, and extend substantially wholly in a common plane. Alternatively, the leads 13 may extend substantially in a plurality of parallel planes. The connector pieces 17 also extend substantially parallel to the major surface 11 of the heat sink 10, and in the same common plane, or plurality of parallel planes, as the leads 13.

The second connector 20 comprises a block 21 of electrically insulating material, in bores 22 in which block 21 are provided a plurality of electrically conducting connector pieces 23, with a connector piece 23 individually in each bore 22. Each connector piece 23 has a socket part 24 to co-operate with a spigot part 19 of the connector 14 of the circuit assembly. For this purpose a portion of the socket part 24 extends beyond the associated bore 22. Within the bore 22 the socket part 24, comprising a terminal of the circuit assembly, is secured to a conductor 25. The connector piece 23 extends from the end of the bore 22 remote from the portion of the socket part 24 to co-operate with the connector 14. For convenience, in the illustrated arrangement, adjacent pairs of leads 25, whilst extending substantially wholly parallel to each other, are in two spaced planes to facilitate making electrical contact therewith.

Because both the modules 12 and the connector 14 are supported on the major surface 11 of the heat sink 10, the location within the circuit assembly of the modules 12 and of the terminals 24 of the circuit assembly are facilitated.

Thus, it is possible easily to provide a desired circuit assembly, and in particular to provide the required electrical interconnections between the modules 12 and the terminals 24, without the necessity of including a printed circuit board within the circuit assembly.

In order to facilitate the extraction of heat from the heat sink 10, the heat sink is provided with fins 30, and so the heat sink is only substantially planar in form.

At least one module of the illustrated circuit assembly may be omitted, and at least one discretely packaged component, possibly only having two leads extending therefrom, provided instead, there being at least one module or component provided in the circuit assembly.

It is not essential that all the connector pieces 17 of the provided connector 14 co-operate with modules or components. Thus, for example, one of the illustrated modules 12 may be omitted from the circuit assembly, or different modules having different numbers of leads.

The modules may have any convenient construction, and for example, comprise thin film modules of known forms.

The modules may have any convenient construction, and, for example, comprise thin film modules of known forms.

Components, when provided, may comprise any known forms of components, such as resistors and capacitors.

The connector pieces 17 may be secured to the block 15 in any convenient way instead of being a press fit therein.

With some such arrangements the modules and/or components of the circuit assembly according to the present invention may be replaceable, for example, when faulty, the connector pieces being removed from the block 15 for this purpose. It is required that the modules and/or components are detachably secured to the substrate, the connector pieces 17 are detachably secured to the block 15, and the module leads 13 are detachably secured to the connector pieces 17, for this purpose.

Alternatively, the connector pieces 17 may be secured to the block 15 by an electrically insulating potting compound. With such an arrangement it is not convenient to replace any module or component of the circuit assembly. Usually each connector piece 23 extends parallel to at least substantially the whole of the lead 13 to which it is connected through a connector piece 17.

When the leads 13 of at least one module 12 or component of the circuit assembly extend from more than one surface of the module or component, it may be convenient to provide more than one connector 14 on the major surface 11 of the heat sink.

At least one connector 14 may be provided on each of both major surfaces of the at least substantially planar substrate.

Thus, at least one module or component of the circuit assembly according to the present invention may be provided on each of both opposing major surfaces of the least substantially planar heat sink 10, possibly a common second connector 20 co-operating with the connectors on both opposing major surfaces of the substrate with such a circuit assembly.

In addition, or alternatively, some leads may extend from the major surface 11 of the substrate to the opposite major surface, especially when leads extend from more than one surface, and, for example, opposing surfaces, of at least one module or component of the circuit assembly. Thus, the leads may extend substantially wholly in two spaced planes, parallel to the major surface 11 of the heat sink 10.

Each connector 14 may be secured to the heat sink in any convenient way.

The modules and/or components of the circuit assembly may be secured to the heat sink in any convenient way.

The combination of each connector 14 and the constituent modules and/or components of the circuit assembly, when secured to the connector, may comprise a sub-assembly unit or units, which sub-assembly unit, when formed, is secured to the substrate.

The at least substantially planar substrate may not comprise a heat sink, for example, being of electrical insulating material. The electrical insulating block of each connector 14 may be integral with the electrical insulating substrate. Thus, a sub-assembly unit may not include the electrical insulating block of each connector 14.

The connector pieces may have any convenient form. It may not be necessary to secure the leads to the connector pieces before the connector pieces are secured to the block of electrical insulating material.

The leads may be secured to the connector pieces in any convenient manner.

The connector pieces may not be substantially embedded in the insulating block, but instead the connector pieces may be exposed after being secured to the block.

A circuit assembly according to the present invention may be connected to at least one associated circuit assembly to form a more complex circuit assembly than any constituent circuit assembly. In particular, required electrical interconnections between a plurality of constituent modules and/or components of a circuit assembly according to the present invention may be provided by the associated circuit assembly.

At least one first circuit assembly, of any one of the forms described above, and according to the present invention, may be connected to at least one second circuit assembly, comprising the associated circuit assembly referred to above, to form a more complex circuit assembly comprising another aspect of the present invention, and more complex than any constituent circuit assembly.

Said at least one second circuit assembly may at least include a pattern of conductors on an electrically insulating support, such as a printed circuit board.

Modules and/or components of the more complex circuit assembly may be provided in said at least one second circuit assembly.

As shown in FIG. 1, a second circuit assembly 40 may be connected directly to the terminals of said at least one first circuit assembly.

Any such arrangement is advantageous in that designing the construction of the more complex circuit arrangement is facilitated; it is easy to remove a first circuit assembly with a faulty component or module: and it is possible to have a standard construction for each first circuit assembly, and perhaps also it is possible to have a standard construction for each second assembly, for each of a plurality of different possible more complex circuit assemblies, each different possible first circuit assembly, and perhaps also each different possible second circuit assembly, respectively, varying from each other only in the form of, and/or in the number of, constituent modules and/or components, where appropriate.

What we claim is:

1. A circuit assembly comprising an at least substantially planar substrate, at least one component with leads extending therefrom, at least one connector having a plurality of electrically conducting connector pieces, each connector piece being directly connected with a lead of said at least one component, the plurality of connector pieces being secured at a block of electrical insulating material of the connector, said at least one component being secured to one major surface of said substrate and said at least one connector being coherently secured to said one major surface of said substrate, and a second connector secured to the at least one connector and further providing connector pieces for the second connector extending substantially parallel to said one major surface, comprising terminals of the circuit assembly, and in which at least substantially the whole of at least some of the leads of said at least one component extends at least substantially parallel to said one major surface of the substrate.

* * * * *